United States Patent [19]

Sharma et al.

[11] Patent Number: 5,491,640
[45] Date of Patent: Feb. 13, 1996

[54] METHOD AND APPARATUS FOR SYNTHESIZING DATAPATHS FOR INTEGRATED CIRCUIT DESIGN AND FABRICATION

[75] Inventors: Balmukund K. Sharma, Santa Clara; Mossaddeq Mahmood, San Jose, both of Calif.

[73] Assignee: VLSI Technology, Inc., San Jose, Calif.

[21] Appl. No.: 272,205

[22] Filed: Jul. 8, 1994

Related U.S. Application Data

[63] Continuation-in-part of Ser. No. 877,951, May 1, 1992, abandoned.

[51] Int. Cl.$^6$ .................................................. G06F 15/60
[52] U.S. Cl. .......................... 364/488; 364/489; 364/490
[58] Field of Search .................................. 364/488, 489, 364/490, 491, 578; 395/920, 921

[56] References Cited

U.S. PATENT DOCUMENTS

| | | | |
|---|---|---|---|
| 4,831,543 | 5/1989 | Mastellone | 364/489 |
| 4,922,432 | 5/1990 | Kobayashi et al. | 364/490 |
| 4,967,367 | 10/1990 | Piednoir | 364/489 |
| 5,146,583 | 9/1992 | Matsunaka et al. | 364/489 |
| 5,163,016 | 11/1992 | Har'el et al. | 364/578 |
| 5,175,843 | 12/1992 | Casavant et al. | 364/491 |
| 5,197,016 | 3/1993 | Sugimoto et al. | 364/490 |

OTHER PUBLICATIONS

Kahrst, Mark, "Matching a Parts Library in a Silicon Compiler," IEEE, Nov. 11–13, 1986, pp. 169–172.
Mahmood, Mossaddeq et al., "A Datapath Synthesizer for High–Performance ASICs," IEEE, May 3–6, 1992, pp. 5.1.1–5.1.4.
Hadley et al., "An Efficient Eigenvector Approach for Finding Net List Partitions", IEEE 1992, pp. 885–892.
Paulin et al., "HAL: A Mult–Paradigm Approach to Automatic Data Path Synthesis", IEEE 1986, pp. 587–594.
Tseng et al., "Automated Synthesis of Data Paths in Digital Systems" IEEE 1986, pp. 379–395.

*Primary Examiner*—Kevin J. Teska
*Assistant Examiner*—Tan Nguyen
*Attorney, Agent, or Firm*—Kickman & Beyer

[57] ABSTRACT

A method for fabricating an integrated circuit includes the steps of: (a) developing a set of circuit specifications for an integrated circuit; (b) encoding the set of circuit specifications in a hardware description language (HDL); (c) synthesizing a netlist including a sequential datapath with a datapath synthesizer from the HDL; and (d) fabricating an integrated circuit as specified by the netlist. A method for datapath synthesis includes the steps of: (a) providing a datapath library including sequential components and combinational components; (b) developing a set of circuit specifications for an integrated circuit; (c) encoding the set of circuit specifications in a HDL; (d) developing a number of IC expression trees derived from the HDL; (e) matching the IC expression trees with library expression trees derived from the datapath library to provide a map of matches; and (f) synthesizing according to the map to create a datapath netlist including both sequential datapaths and combinational datapaths. A datapath synthesizer includes a digital processor, memory coupled to the digital processor, and a datapath library stored in the memory. An input device is used to input a HDL description of circuit specifications into memory, and an IC expression generator develops a number of IC expression trees from the HDL. A matcher compares the plurality of IC expression trees with library expression trees derived from the datapath library to provide a map of matches, and a synthesizer provides a netlist including both sequential datapaths and combinational datapaths according to the map.

21 Claims, 11 Drawing Sheets

```
entity design is
    part (a, b: in bit;
            x: out bit;
          increment, clk: in bit;
            count: buffer bit_vector(15 downto 0);
         );
    end design;

architecture specification of design is begin
    process(a, b, clk)
    begin
        x <= a or b
            if clkevent and clk = '1' then
                if increment = '1' then
                    count <= count + 1
                else
                    count <= count - 1
                end if;
        end process;
end specification;
```

*Figure 4*

DATAPATH LIBRARY

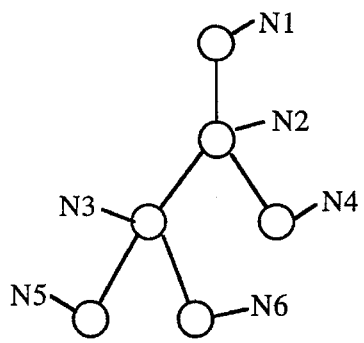
Figure 9
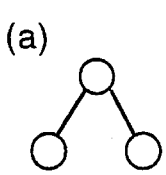  (a)
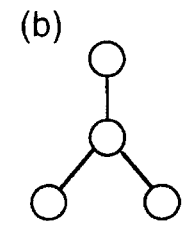  (b)
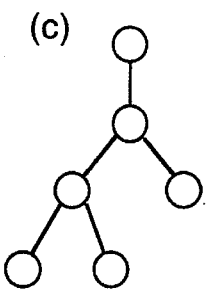  (c)
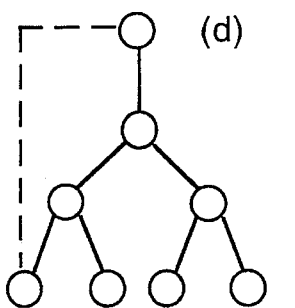  (d)
Figure 10
112 →
| STEP | MATCH STACK | TERMINAL STACK | MAP |
|------|-------------|----------------|-----|
| A    | (c)<br>(b)  |                |     |
| B    | (b)         | N4<br>N5<br>N6 |     |
| C    | (b)         |                | (c) |
| D    |             | N4<br>N3       | (c) |
| E    |             | N3             | (c) |
| F    | (a)         |                | (c) |
| G    |             | N6<br>N5       | (c) |
| H    |             |                | (a) (b) (c) |
Figure 11

METHOD AND APPARATUS FOR SYNTHESIZING DATAPATHS FOR INTEGRATED CIRCUIT DESIGN AND FABRICATION

CROSS REFERENCE TO RELATED APPLICATIONS

This application is a continuation-in-part (CIP) of co-pending U.S. patent application Ser. No. 07/877,951, filed May 1, 1992 on behalf of Mossaddeq et al., entitled "Improved Datapath Synthesis Method and Apparatus Utilizing a Structured Cell Library", assigned to the assignee of the present application, and incorporated herein by reference in its entirety, now abandoned.

BACKGROUND OF THE INVENTION

The present invention relates generally to synthesis of integrated circuits and more particularly to synthesis of datapaths in integrated circuits.

The development of the integrated circuit (IC) chip has been integral to the improvement and advancement of many industries. As the complexity and functionality of these ICs has increased, their incorporation into a variety of products has likewise increased. While in some situations, a designer is able to use standard ICs for a desired application, in other situations standard chips are unable to meet the precise needs of a designer. In such situations, designers often turn to an application specific integrated circuit (ASIC).

ASICs allow a designer to design a circuit with specifications and functionality closely tailored to their desired product application, without having to conform their product to the feature and performance limits of a standard chip. Typically, ASIC production begins with a set of circuit specifications. This design is then written in a hardware description language (HDL), such as VHDL®, the IEEE standard. The description is then "synthesized", i.e., a computer program uses the set of circuit specifications encoded in an HDL to design the circuitry of the IC. Next, the behavior of the circuit is verified and, ultimately, a circuit layout is created. From the layout, a mask is formed and used for the IC chip (ASIC) production.

In copending U.S. patent Ser. No. 07/877,951, referenced above, a datapath synthesizer converts an HDL circuit specification into a datapath netlist. The behavioral description of the specified circuit is divided into two distinct parts: datapath logic and random ("control") logic. The random logic is implemented using gates from a gate library (for example a standard cell or gate array library) using a logic synthesizer. The datapath logic is optimally synthesized using a datapath synthesizer having a library of datapath components ("cells").

The problem encountered is how to optimally synthesize an IC HDL specification. Previously, datapath synthesis tools were able to map HDL specification only to combinational datapath components and memory elements (such as flip-flops and latches) in the datapath Library. Previous datapath synthesis tools could not map HDL specifications implying sequential logic to sequential components in the library. Instead, combinational components and memory elements such as such as (such as flip-flops and latches) were used.

For example, if a counter (which is sequential logic) was implied by the HDL specification, and a counter component (which is a sequential component) existed in the library, previous tools were unable to map the counter component. Instead, a counter was built using an adder or incrementor and a flip-flop register, which tended to be, a non-optimal solution.

SUMMARY OF THE INVENTION

The present invention includes a datapath synthesizer which maps a HDL specification to both combinational components and sequential components available in a datapath library. This permits datapaths to be optimized to a greater degree than was previously possible.

For example, if a counter (sequential logic) was implied by the HDL specification, and a counter component (a sequential component) existed in the library, previous tools were unable to map the counter component. Instead, a counter was built using an adder (or an incrementor) and a flip-flop register. Using the invention described here, a counter component is used instead. This allows for better integrated circuit optimization.

A method for fabricating an integrated circuit in accordance with the present invention includes the steps of: (a) developing, a set of circuit specifications for an integrated circuit; (b) encoding the circuit specification in a hardware description language (HDL) and inputting the hardware description language into a digital computer; (c) synthesizing a netlist that can include sequential components derived from a datapath library stored on the computer; and (d) fabricating an integrated circuit as specified by the netlist. The synthesization step preferably includes the steps of: (a) parsing the HDL into a controlled data flow graph (CDFG); (b) generating an IC expression tree for each output of the IC in terms of primary inputs and constraints using the CDFGs; (c) partitioning each IC expression tree into a random logic category and a datapath category; (d) synthesizing random logic using random logic synthesis to create a random logic netlist; (e) synthesizing datapath using datapath synthesis to create a datapath netlist including both sequential components and combinational components; and (f) combining the datapath netlist and random logic netlist to develop an IC netlist.

A method for datapath synthesis includes the steps of: (a) providing a datapath library including sequential components and combinational components; (b) developing a set of circuit specification for an integrated circuit; (c) encoding the set of circuit specifications in a hardware description language; (d) developing a number of IC expression trees derived from the hardware description language; (e) matching the IC expression trees with library expression trees derived :,from the datapath library to provide a map of matches; and (f) synthesizing both sequential and combinational components according to the map to create a datapath netlist. Preferably, the steps of generating a number of IC expression trees includes the steps of parsing the hardware description language into control data flow graphs (CDFGs), and generating an IC expression tree for each output of the IC in terms of primary inputs and constraints.

In the present invention, behavior of the sequential components and combinational components of the datapath library are written in the same hardware description language that is used for the IC specifications, and the step of developing the library expression trees includes the steps of parsing the hardware description language of the sequential components and combinational components of the datapath library, and generating an expression tree for each output of each of the sequential components and combinational components in the datapath library.

A datapath synthesizer in the present invention includes a digital processor, memory coupled to the digital processor, and a datapath library stored in the memory, where the datapath library includes both sequential components and combinational components. An input device is provided to input the HDL that encodes the circuit specifications for a desired integrated circuit into the memory of the system. An IC expression tree generator develops, using the digital processor, a number of IC expression trees derived from the HDL, and a matcher compares, using the digital processor, the IC expression trees with library expression trees derived from the datapath library to provide a map. Finally, a synthesizer creates a datapath netlist using both the sequential datapaths and combinational datapaths according to the map.

The method and apparatus of the present invention are therefore advantageous in that a more optimal IC design can be produced. This is because sequential logic can be synthesized in a datapath synthesizer which uses an optimized library of sequential components and optimization criteria designated by a circuit designer. It is therefore possible to design smaller, faster, and less expensive integrated circuits than was possible with previous synthesis techniques.

These and other advantages of the present invention will become apparent upon reading the following detailed descriptions and studying the various figures of the drawings.

BRIEF DESCRIPTION OF THE DRAWINGS

FIG. 4 is an example of hardware description language (HDL) used in the present invention;

FIG. 9 is an example of an IC expression tree;

FIG. 10 is an illustration of components within the datapath library including both combinational components and a sequential component;

FIG. 11 is a table used to describe the operation of the process of FIG. 8 in conjunction with the examples of FIGS. 9 and 10;

FIG. 13c is a library expression tree for an incrementor component;

FIG. 13d is a library expression tree for a decrementor component;

Detailed Description of the Preferred Embodiments

Figure 1:
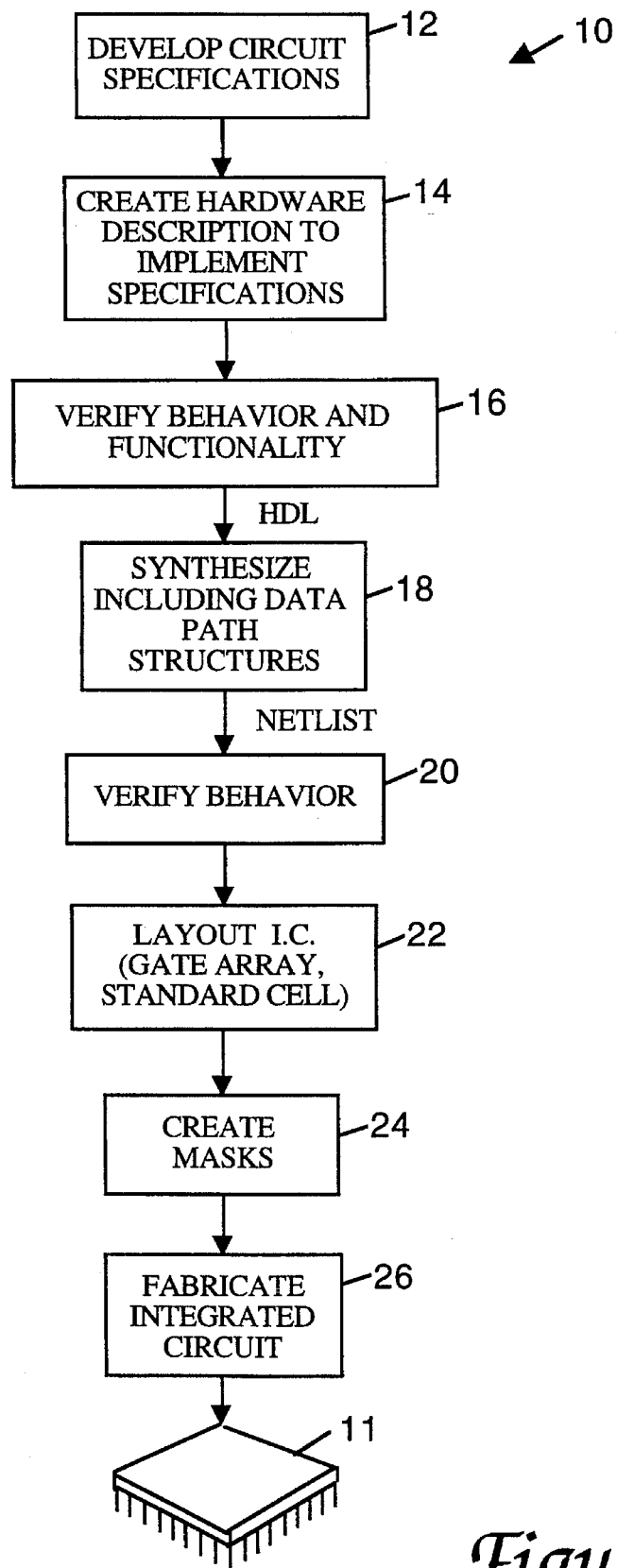
FIG. 1 is a flow diagram illustrating a process for producing an integrated circuit in accordance with the present invention.

FIG. 1 illustrates a method 10 in accordance with the present invention for producing an integrated circuit (IC) 11. The method begins in step 12 with the development of the circuit specifications to implement a desired design. For example, required inputs and outputs are specified, as are speed and other performance parameters. After creating the circuit specifications, the process continues with step 14 and a hardware description is written by a circuit designer in a hardware description language (HDL) such as the IEEE Standard VHDL® (VHSIC Hardware Description Language), or Verilog®, a standard from Open Verilog International. Once the circuit is specified, the functionality may then be verified in step 16 by logic simulators which operate directly on the HDL. The process then proceeds with step 18 with the synthesis of the specified circuit including data path structures from the HDL. Once the synthesis is completed, the resulting netlist for the circuit is verified for proper behavior and functionality in step 20 by a logic simulator which operates on the netlist. With the circuit functionality verified, the process continues with layout of the circuit in step 22. For example, the layout could be a gate array layout, a standard cell based layout, or a bit-slice layout. Once the circuit layout is completed, a mask of the layout is created in step 24. This mask is then used to fabricate the integrated circuit (IC) chip 11 in a step 26. Steps 12–16 and 20–26 are well known to those skilled in the art.

Figure 2A:
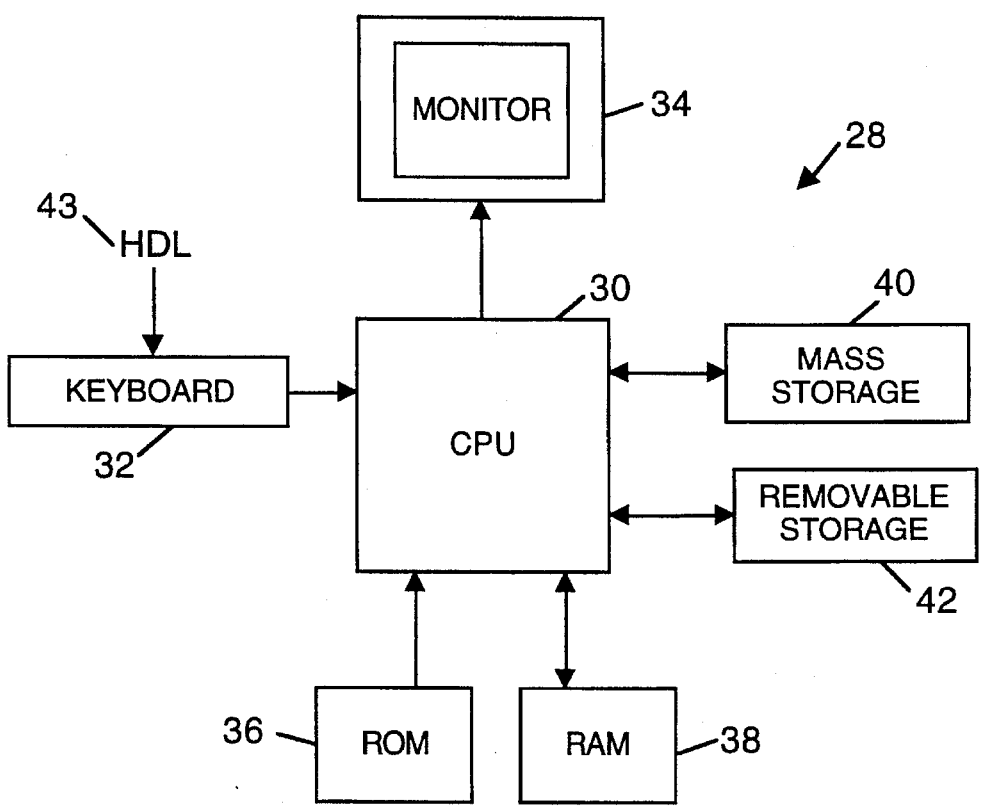
FIG. 2a is a block diagram of a computer system used to implement a portion of the process illustrated in FIG. 1.

FIG. 2a is a block diagram of a computer system 28 used to implement at least part of process 10. This system includes a digital processor or central processing unit (CPU) 30, a keyboard input device 32, a monitor output device 34, read-only memory (ROM) 36, random-access memory (RAM) 38, mass storage 40, and removable storage 42. As used herein "memory" will refer collectively to any form of memory accessible by the CPU 30, including, but not limited to, ROM 36, RAM 38, mass storage 40, and removable storage 42.

Keyboard 32 is a preferred user input device for entering HDL 33 for use by the CPU 30, but other devices and input methods are well known to those skilled in the art. Mass storage 40 is typically a hard disk storage unit capable of storing many megabytes of data in a non-volatile fashion. Removable storage device 42 is typically a floppy disk unit used to transfer data to and from computer system 28.

An example of a computer system 28 suitable for use with the present invention is an HP 700 Series workstation, available from Hewlett-Packard, Cupertino, Calif. or a SUN SPARC workstation available from Sun Microsystems, Inc., of Mountain View, Calif. Of course, other computer systems that are capable of supporting integrated circuit synthesis are also suitable.

Figure 2B:
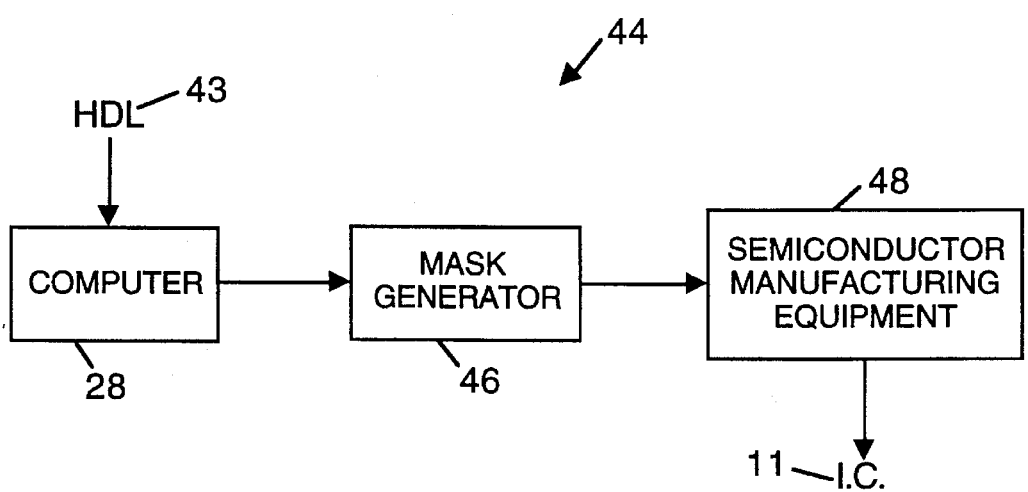
FIG. 2b is a block diagram of a system for producing an integrated circuit in accordance with the process of FIG. 1.

In FIG. 2b, a block diagram of a system 44 for producing an IC 11 in accordance with the present invention. The specification of IC 11 are input as HDL 43 into the computer system 28. A mask generator 46 creates a set of IC masks from mask generation data provided by computer system 28. The mask generator 46 can either be implemented as a part of the computer system 28 or as a separate system. An example of a suitable mask generator in machine form is MEBES® available from Mebes, Inc. An example of a mask generator in software form is DRACULA® available from Cadence Design Systems, Inc., of Santa Clara, Calif. This mask generator 46 fabricates masks which are then used with semiconductor manufacturing equipment 48 during the production of the IC 11. Semiconductor manufacturing equipment 48 typically includes such items as stepper lithography units available from Cannon, Inc. and Nikon, Inc. of Japan, among others, which directly utilize the mask sets for photolithography processes.

At this point, some definitions will be useful. "Combinational logic" includes one or more logic elements connected in such a fashion that the output(s) of the combinational logic depend only on the current input(s). Examples of combinational logic include adders, incrementors, etc. Combinational logic implies no internal memory. Components exhibiting combinational logic are known as "combinational components."

In contrast, "sequential logic" implies memory. The output(s) of sequential logic depend upon both upon its input(s) and its current state as stored in the memory element(s). "Current state" implies information about previous states and previous inputs. Examples of sequential logic include counters and accumulators. Components exhibiting sequential logic are referred to as "sequential components."

The memory elements for sequential logic can include a D Flip-Flop (DFF) component or a latch component. A DFF has one primary input "d", one primary output "q", and a clock input "clk." It optionally also has synchronous and/or asynchronous reset inputs. At either a rising or falling edge of the clock input (depending upon the type of DFF), the input d is transferred to the output q, creating a "state" of the DIFF. The output q remains at that state until the next clock input.

In contrast to a DFF, a latch component has a primary input "d", a primary output "q", and an enable input "e." It optionally also has synchronous and/or asynchronous reset inputs. When the enable input e is activated, the input d is passed to the output q. The input d will continue to be passed to the output q until the enable input e is disabled, i.e. the latch is "latched." At that time, output q will remain steady, creating a "state" of the latch.

Sequential logic can be made by combining combinational logic with memory elements, such as DFFs or latches. The "state" of the memory element is used as one of the inputs to the sequential logic such that the output(s) of the sequential logic is dependent upon both its inputs and its current state.

Figure 3:
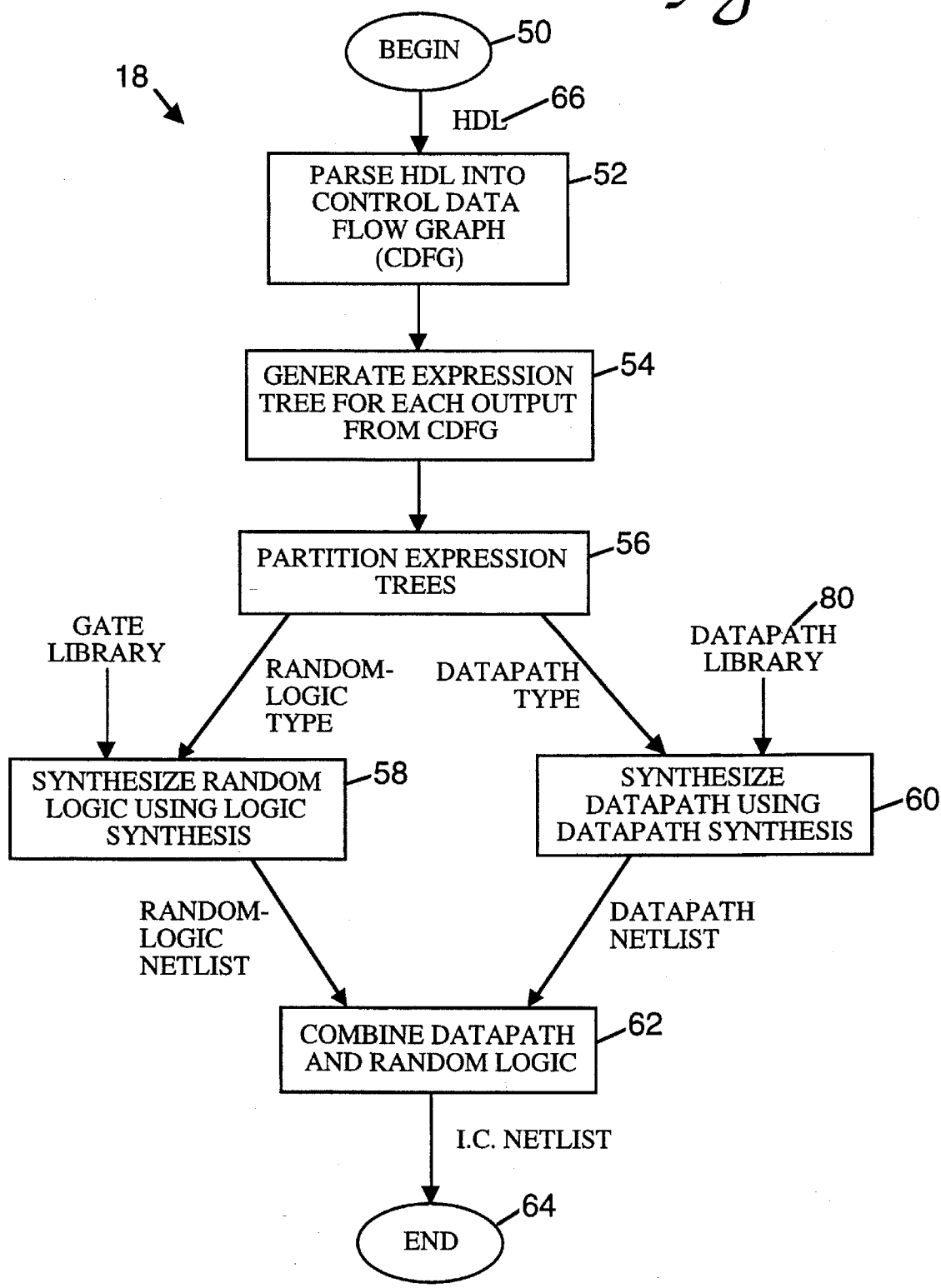
FIG. 3 is flow diagram illustrating the "Synthesize Including Datapath Structures" step of FIG. 1.

In FIG. 3, the step 18 "Synthesize Including Datapath Structure" of process 10 of FIG. 1 is illustrated in greater detail. The process 18 begins at 50 and in a step 52, the hardware description language (HDL) provided by a user to define the circuit specifications of the integrated circuit 11 is parsed to a control data flow graph (CDFG). As it is well know to those skilled in the art, a CDFG is a graph with nodes and directed edges. Nodes represent actions or assignments, and the edges represent transfer of control from one node to another. Each edge is associated with a condition under which control passes from one node to another. A reference describing CDFGs is found in "On Optimal Extraction of Combinational Logic and Don't Care Sets from Hardware Description Languages", *G. Colon-Bonet et al.*, ICCAD 1989.

Next, in a step 54, an expression tree is generated for each output from the CDFG. As is well known to those skilled in the art, an expression tree has a root node, a set of intermediate nodes, leaf nodes and a set of directed edges that point from one node to another. A leaf node represents a primary input or a constant. An intermediate node represents an operation. The associated operation is applied to the nodes to which edges of the intermediate node are pointing. Examples of such operations in the present invention are "+","−","*","AND","IF", "DFF" and "LATCH." The DFF and LATCH nodes are memory nodes that store a state.

The methods for generating expression trees from CDFG are well known to those skilled in the art. In general, the expression trees fall into two categories: 1) acyclic expression trees corresponding to combinational logic; and 2) cyclic expression trees corresponding to sequential logic. Acyclic expression trees derive their name from the fact that there are no feed-back loops or "cycles" in the expression tree, as opposed to cyclic expression trees which include such feed-back loops. In the present invention, for all properly described synchronous circuits, the cycles in cyclic expression trees always pass through one or more memory nodes (DFFs or latches). Therefore, all feedback occurs in sequential logic in the present implementation.

An acyclic expression tree is also referred to in the literature as a directed acyclic graph (DAG). The *G. Colon-Bonet et al.* reference cited above describes expression trees and their derivation from CDFGs.

In a step 56, the expression tree is partitioned. By "partitioning", it is meant herein that the expression trees are categorized into datapath types and random logic types. The datapath is generally more complex and is composed of operations that are likely to be stored in the datapath library. Examples of datapath types are multi-bit operations (such as 16-bit multiplier, adder, counter, etc.). Generally, optimized datapath cells corresponding to such operations are available in the library. Simpler logic and left-over logic can be categorized as a random logic type which does not require datapath optimization and, therefore, would not be stored within the datapath library as a component.

The random logic type expression trees are sent to a random logic synthesizer which uses a gate library to produce random logic. Such synthesis is well known to those skilled in the art. The output of the "Synthesize Random Logic Using Logic Synthesis" step 58 is a random-logic netlist including a specification of gates and their interconnections.

Datapath-type expression trees undergo a process 60 which synthesizes the datapath using datapath synthesis techniques. As will be discussed in greater detail subsequently, a datapath library is used to match against the IC expression trees and, after optimization, a datapath netlist is produced by this step 60. The random-logic netlist and the datapath netlist are combined in a step 62 to provide the an IC netlist. Process 18 then ends at 64.

In FIG. 4, an example of a hardware description language representation of a circuit specification is shown. As it is well known to those skilled in the art, HDL is a relatively high-new language which allows circuit specifications to be defined in terms of input, output, and various parameters such as clock speed, register types, etc. In the example of FIG. 4, three distinct sections of HDL are shown. In a section 68, a definition is made of a part including in inputs "a" and "b", and output "x", and a 16-bit up-down counter having an output "count" dependent upon inputs "Clk" and "increment." In section 70, the output x is assigned the value of a or b, which is simply combinational logic. In section 72, the 16-bit up-down counter is described in HDL. This up-down counter described in section 72 is a complex sequential logic device.

Figure 5A:
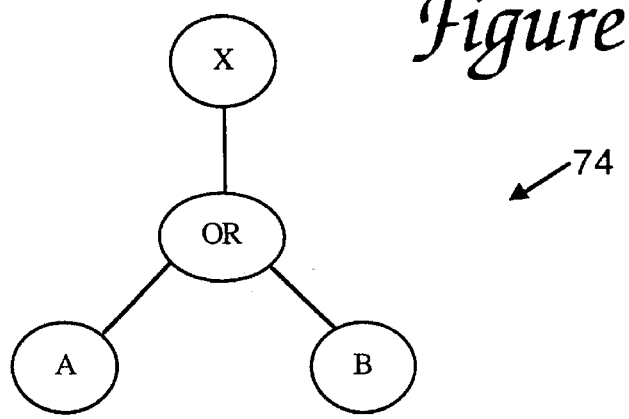
FIG. 5a illustrates the "Generate Expression Tree For Each Output From Each CDFG" step of FIG. 3 as applied to combinational logic.

Using the example of the hardware description language 66 of FIG. 4, and referring again to the process 18 of FIG. 3, the HDL 66 is parsed in a step 52 into control data flow graphs (CDFGs), again by techniques well known to those skilled in the art. These CDFGs are then converted into expression trees in a step 54 for each output from the CDFG. The expression tree defined by section 70 of FIG. 4 is shown at 74 in FIG. 5a. Here the expression tree for output x is defined by an OR node. This node had edges that point to leaf nodes "a" and "b."

Figure 5B:
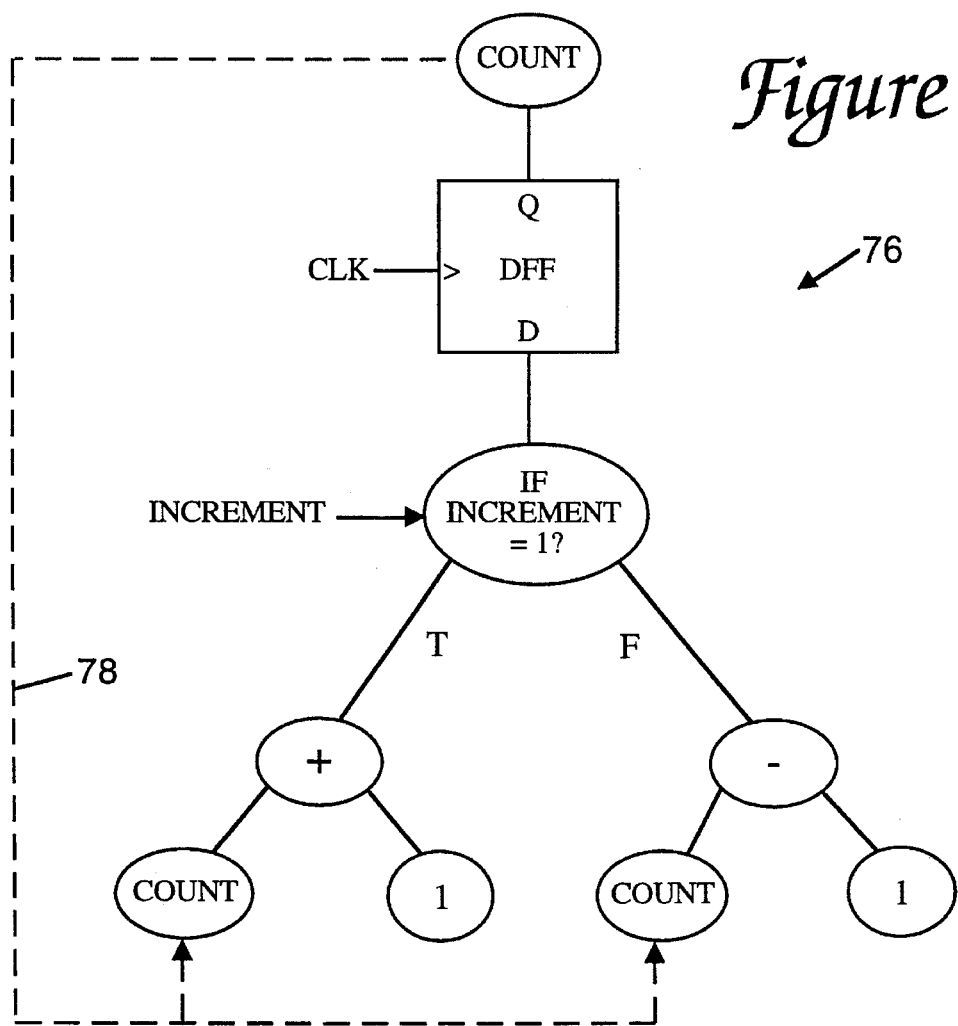
FIG. 5b illustrates the "Generate Expression Tree For Each Output From Each CDFG" step of FIG. 3 as applied to sequential logic.

In FIG. 5b, the expression tree for section 72 of the HDL shown in FIG. 4 as produced by process 54 of FIG. 3 is as illustrated at 76. Since the expression tree 76 represents sequential logic, it includes a device which stores a current state which is used as a feed-back input to the logic In this instance, the state-storing device is a D-type Flip-Flop (DFF) which holds a value "count" at its q output. The DFF is clocked by the: signal Clk and has a d input. The d input of the DFF is coupled to a decision (i.e. "If") node which determines whether the input signal "increment" is equal to 1 and, if it is, it develops a signal at the d input of the DFF equal to "count+1", i.e. the variable "count" is incremented by one. If the input signal "increment" is not equal to 1, a signal is provided to the d input of DFF equal to "count-1", i.e. the count is decremented by one.

It should be noted that this expression tree 76 is cyclic since the output "count" is also an input "count" to the expression tree 76 as indicated by the broken line 78. In the past, cyclic expression trees were not optimally mapped. See, for example, "DAGON: Technology Binding and Local Optimization by DAG Matching.", *K. Keutzer*, 24th DAC, 1987, pp 341–347. It should also be noted that the expression tree 76 is a sixteen bit expression tree, implying a 16-bit up-down counter.

Figure 6:
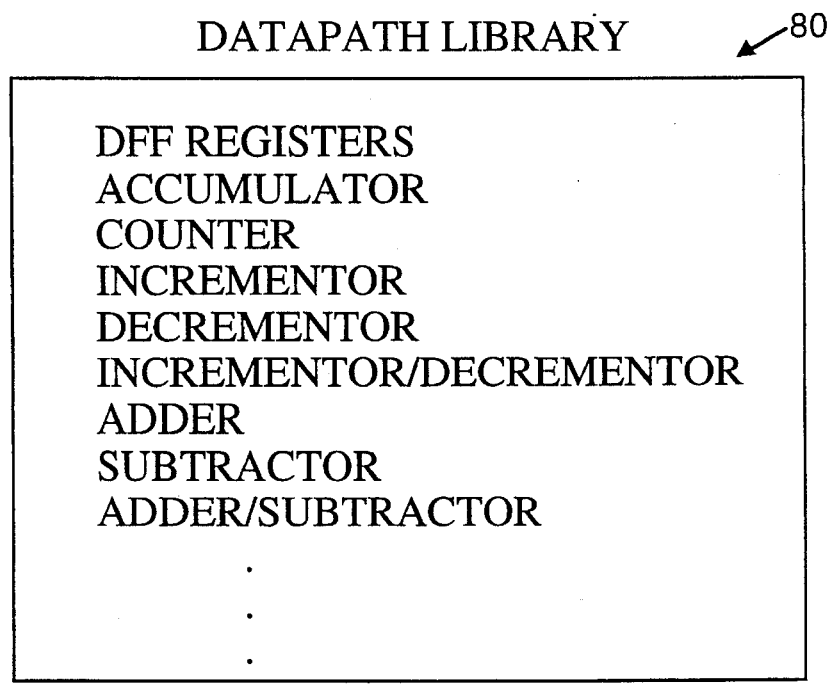
FIG. 6 is an illustration of the datapath library including both sequential components and combinational components.

In FIG. 6, a datapath library 80 is illustrated. The datapath library includes sequential components including a DFF register, an accumulator, a counter, an incrementor, a decrementor, an incrementor/decrementor, etc. as well as combinational components including an adder, a subtractor, etc. The term "component" as used herein is also referred to as a "cell" in the industry. Therefore "cell" and "component" will be used somewhat interchangeably herein when referring to the entries in the datapath library.

In the present invention, the functionality of various datapath components in the library is described using the same hardware description language (HDL) that was used to defined the IC specification. Therefore, a datapath component can be processed using the same parsing and expression tree generation algorithms as were used to process the IC specification HDL.

It should be noted that since the datapath library 80 includes both sequential and combinational components, the datapath netlist can include both sequential and combinational components. This is an important feature of the present invention since, in the past, sequential logic was inefficiently implemented by combining combinational components with memory components (such as DFFs and latches). In the present invention, optimized sequential components can be inferred, which provides a considerable degree of optimization in contrast to implementing sequential logic using combinational components and memory components (DFFs and latches), as in the prior art.

Figure 7:
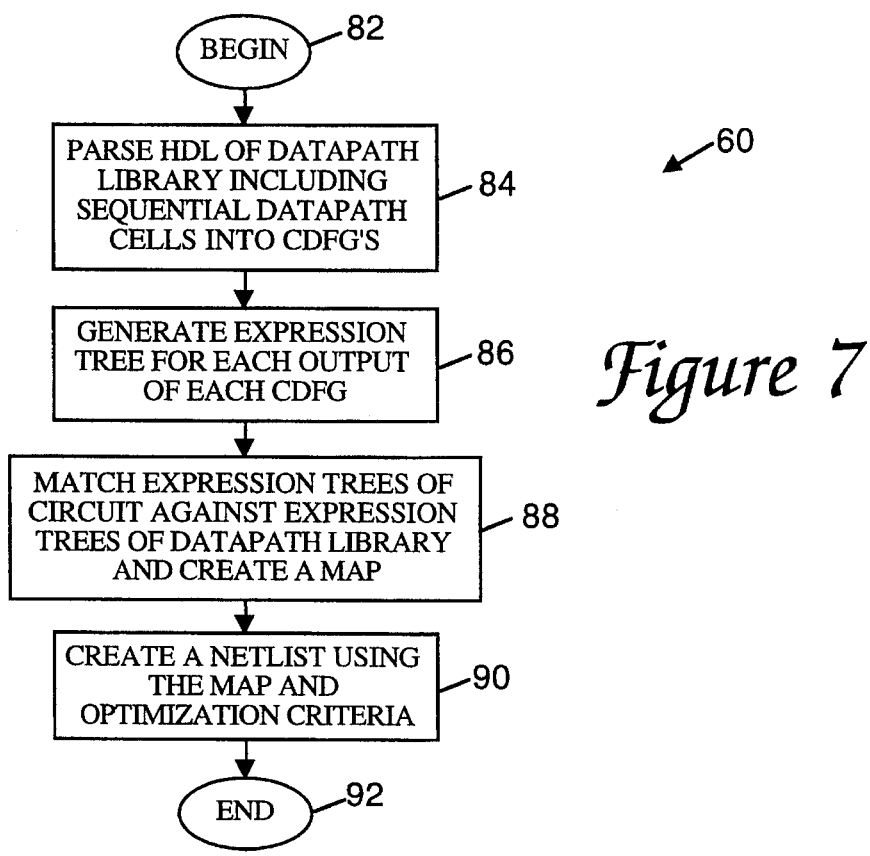
FIG. 7 is a flow diagram illustrating the "Synthesize Datapath Using Datapath Synthesis" step of FIG. 3.

In FIG. 7, the "Synthesize Datapath Using Datapath Synthesis" of step 60 of FIG. 3 is discussed in greater detail. The process 60 begins at 82 and, in a step 84, the HDL of the datapath library is parsed. As described previously, the datapath library includes both sequential components and combinational components. This parsing step 84 is analogous to the parsing step 52 which is performed on the HDL describing the IC specifications. The output of the parsing step is a number of control data flow graphs (CDFGs) representing the datapath components from the datapath library.

Next, in a step 86, an expression tree is generated for each output of each CDFG produced by step 84. Again, this step is analogous to the step 54 of FIG. 3 where an expression tree is created for each output of each CDFG developed from the HDL used to encode the circuit specifications.

It should be noted that steps 84 and 86 can be :skipped by simply storing the expression trees for each output of each CDFG of each datapath component in the datapath library. However, this will consume considerable storage space, and therefore is not desirable. Since steps 84 and 86 are not particularly computationally expensive, it has been found that steps 84 and 86 can be repeated once every session without substantially adversely affecting the speed of operation of the system.

Process 60 of FIG. 7 continues with step 88 wherein the IC expression trees are matched against the expression trees of the datapath library, and the wherein of a map indicating these matches is developed. A final step in process 60 is a step 90 wherein a netlist is created using the map created by step 88 and optimization criteria. Optimization criteria are well known to those skilled in the art and includes such criteria as circuit area, circuit speed, circuit power, and circuit delay characteristics. In other words, since there are likely multiple maps from the datapath library to the expression trees for the desired integrated circuit, a map is chosen which provides the best compromise to a given set of optimization criteria. Often, the optimization criteria places a high emphasis on minimum circuit area (i.e. the most compact circuit implementation) which meets timing requirements. Therefore, the various maps are examined for those solutions which provide the minimum IC die area. If the timing of the selected map meets the timing requirements, then that map is finally selected. K. Keutzer, supra, is again useful background art in understanding this process.

Figure 8:
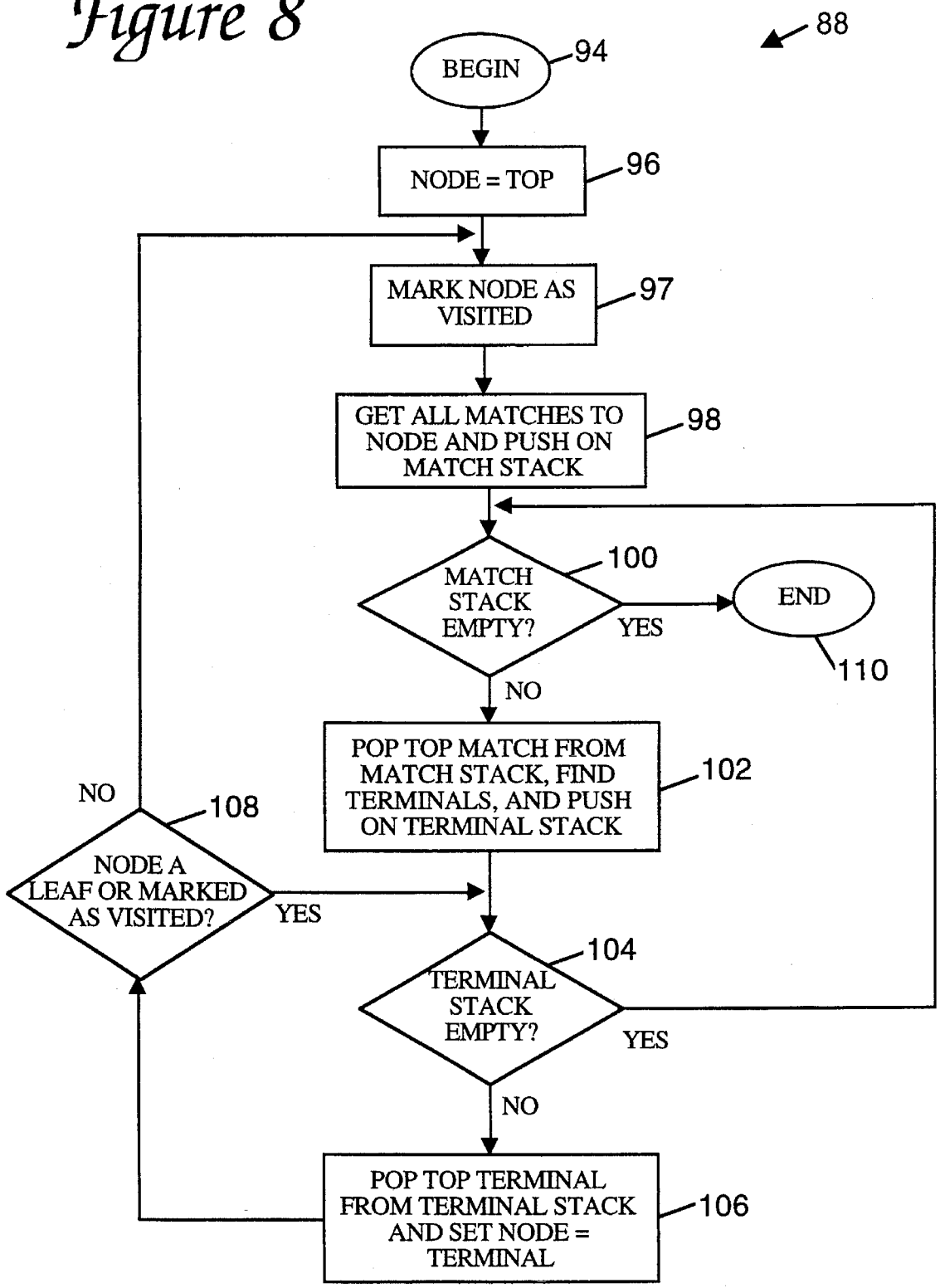
FIG. 8 is a flow diagram illustrating the "Match Expression Trees . . ." step of FIG. 7.

In FIG. 8, the step 88 of FIG. 7 is illustrated in greater detail. The process 88 is a recursive process for mapping all of the datapath library expression trees against each of the IC expression trees specified by the circuit designer's HDL. Of course, as it is well known to those skilled in the art, other recursive methods and non-recursive methods can also be used to create such mappings.

Process 88 begins at 94 and, in a step 96, a variable "node" is assigned the value "top", which is the root node (top) of an IC expression tree. In the next step 97, the node is marked as "visited." This is important, since expression trees in the present invention are cyclic and a node that has been processed might be visited again. Next, in a step 98, all matches from this top node into the datapath library are obtained and pushed onto a first stack referred to as a "match" stack. Next, in a step 100, it is determined whether the match stack is empty. If not, a step 102 pops the top match from the match stack, finds the terminals of the match, and pushes these terminals onto a second stack known as a "terminal" stack. Terminals are the bottom nodes of a match. A terminal can be an intermediate node or a leaf node. Next, in a step 104, it is determined whether the terminal stack is empty. If not, a step 106 pops the terminal from the terminal stack and sets the node equal to that terminal node. A step 108 determines whether the node is a leaf node of the expression tree or if it has already been visited. If so, the process control returns to step 104. If not, process control is returned to step 97.

Note that in step 108 that there is a check to determine whether a node has already been visited. This is necessary since the expression trees of the present invention have cycles. Nodes visited once can be visited again. However, these nodes are processed only once.

When the terminal stack is determined to be empty by step 104, process control is returned to step 100. When the match stack is determined to be empty by step 100, the process 88 is determined to be complete as indicated at 110.

In the following examples, the operation of the present invention is illustrated. More particularly, the mapping of sequential logic to sequential components is illustrated by way of example. Example 1 is a simple example which illustrates how the process of the present invention works on combinational logic. Example 2 illustrates how the present invention maps sequential logic to sequential components, in addition to mapping combinational logic.

EXAMPLE 1

The process 88 of FIG. 8 will be described in terms of an example with reference to FIG. 9, 10, and 11. In FIG. 9, an IC expression tree is shown having six nodes labeled N1, N2, ... N6. Note that the IC expression tree is acyclic in that there are no cycles present in the expression tree. In FIG. 10, four datapath library components labeled (a), (b), (c), and (d) are illustrated as datapath trees. Library expression trees (a)–(c) represent combinational components since there is no feed-back between nodes. Datapath tree (d) represents a sequential component because it provides a feed-back path between the top or output node and a node which is in the flow path to the output node. Therefore, the expression nee (d) represents a component that is dependent upon its own previous output state, such as an accumulator, incrementor, etc.

As used herein, a root or top node is the output node of the expression tree. For example, in FIG. 9, node N1 is the top or output node. Leaf nodes are the bottom-most nodes of an expression tree and are primary inputs of the IC expression tree. In FIG. 9, nodes N4, N5, and N6 are leaf nodes. Intermediate nodes are located between the top nodes and the leaf nodes and correspond to nodes N2 and N3 of FIG. 9.

Using FIG. 9 as an example, the process 88 of FIG. 8 is illustrated by means of a table 112 in FIG. 11. A first column of the table 112 indicates the step during the execution of process 88. A step witch a later letter follows a step with an earlier letter. A second column of table 112 indicates the contents of the match stack under different steps, a third column holds the contents of the terminal stack the different steps, and the fourth column of table 112 indicates the map as it is being built under the different steps. to those skilled in the art, a items can be "pushed" onto a LIFO stack, and then "popped" from the LIFO stack in the reverse order than in which they were pushed. These stacks can be provided in specialized hardware registers, but are preferably implemented in the memory of computer system 28 and managed by a recursive algorithm. For example, the match stack and terminal stack can comprise storage locations within RAM 38 which are managed by a recursive algorithm.

Referring now to FIGS. 8–11, when the process 88 begins, the variable "node" is set to "top", which corresponds to node N1 of FIG. 9. Next the node is marked in a step 97. In step 98, all matches to node N1 are found and pushed onto the match stack. As noted in step A on FIG. 11, the two matches from the datapath library of FIG. 10 are components (b) and (c) which are pushed onto the match stack. Since the match stack is not empty as determined by step 100 of FIG. 8, the top match is popped from the match stack and its "terminal" nodes are found and pushed onto the terminal stack. The top match is component (c) and, therefore, the terminal nodes of component (c), which correspond to nodes N4, N5, and N6 of the expression tree of FIG. 9 are pushed onto the terminal stack, and this state is indicated as step B in table 112. Since all of nodes N4–N6 are leaf nodes as determined in step 108, the terminals N4–N6 are popped from the terminal stack by step 106 until the terminal stack is empty as determined by step 104, and then process control is returned to step 100. This is illustrated in a step C in table 112 wherein the :match stack still includes the match (b) but the map now includes datapath components (c) as a map to the expression tree of FIG. 9.

Since the match stack is not empty as determined by step 100, the next match from the match stack is popped, and its terminal nodes are found and pushed onto the terminal stack. This is illustrated in step D in table 112 wherein the match stack is now empty and the terminal stack includes terminal nodes N3 and N4 corresponding to the mapping of datapath component (B) to the expression tree of FIG. 9. Since the terminal stack is not empty as determined by step 104, the top terminal N4 is popped from the stack and set to the node. This step is indicated at step E of table 12. Since node N4 is a leaf node, the last node N3 is popped from the terminal stack, and step 108 determines that this node N3 is not a leaf node. Therefore, all matches to the node N3 are found in step 98 and pushed onto the match stack. As seen at step F in FIG. 11, this pushes datapath library component (a) onto the match stack. Step 102 then pushes the terminals N5 and N6 onto the terminal stack and removes the match (a) from the match stack, as indicated by step G of table 112. Processes 104–108 are then executed until both of nodes N5 and N6 have been popped from the terminal stack (because they are both leaf nodes) at which time process control returns to step 100. Since the match stack is empty at this point, as indicated in step H, the process is completed at step 110. The map, at this point, includes a first map which maps datapath library component (c) to the expression tree of FIG. 9, and a second map which maps the combination of datapath library components (b) and (a) also to the expression tree of FIG. 9.

Therefore, in this example, two maps from the datapath library to the IC expression tree are possible. At this point, an optimization process is used to determine which of these two maps best meets the needs of the IC designer. It is likely that the map (c) is the best fit, since it matches the expression tree of FIG. 9 exactly and, therefore, is probably highly optimized for that particular function. However, it is possible that the optimization process will choose the map comprising the combination of (b) and (a) as being more desirable because, for example, of other criteria such as timing requirements.

EXAMPLE 2

Consider the following example that represents the behavior of an up-down counter. This example illustrates how a cyclic expression tree that represents sequential logic is mapped to sequential components in the datapath library. Such mapping to sequential components was not possible in previous tools.

Figure 12:
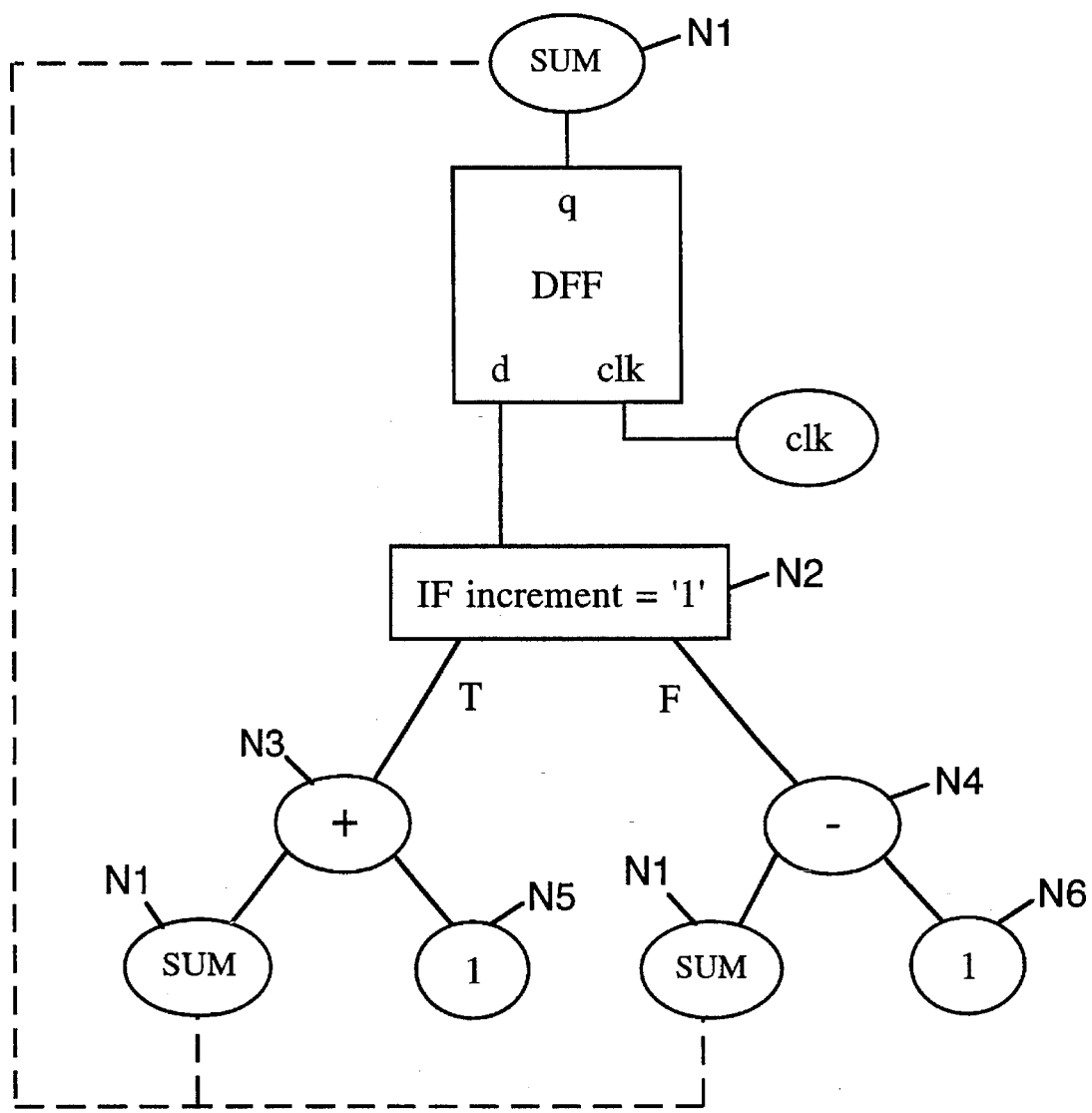
FIG. 12 is a cyclic IC expression tree for an up-down counter.

The HDL description of an up-down counter is found in Listing 1, and its IC expression tree is shown in FIG. 12.

Listing 1: HDL Of An Up-Down Counter

IC SPECIFICATION:

```
entity ic is
    port    (clk,increment : bit;
            sum : out bit_vector(15 downto 0)
            );
end ic;
architecture spec of ic is begin
    process(clk)
    begin
        if clk'event and clk = '1' then
            if increment = '1' then
                sum <= sum + 1;
            else
                sum <= sum - 1;
            end if;
        end if;
    end process;
end spec;
```

Note that feedback exists in this example as seen in broken lines in FIG. 12. The variable "sum", which is the output of the expression tree, is also an input of the expression tree. This is illustrated by node N1 of the expression tree. Such feedback is allowed as long as a memory node or element (in this case DFF) breaks the feedback loop. In the prior art, this expression tree would be mapped to a register, an incrementor, a decrementor and a multiplexor. The incrementor, decrementor and the multiplexor could be replaced by a single incrementor-decrementor datapath component, if one was available in the library. Even if the library had a counter component that implements the above expression tree, the prior art tools would be unable to map it to that component.

The present invention works not only on counters but also on any other sequential component in the library such as accumulators, multiplier-accumulators, multiplexed flip-flops, and registers with control signals such as synchronous reset, synchronous load, and clock enables. All of these components include both combinational logic and memory components.

In the present invention, a comparison of the expression tree of the HDL description being implemented is made with the expression tree for the components ("cells") available in the library. When a match is found, the appropriate component is used. This approach does not place any restriction on mapping memory elements and combinational parts of the expression tree separately.

Figure 13A:
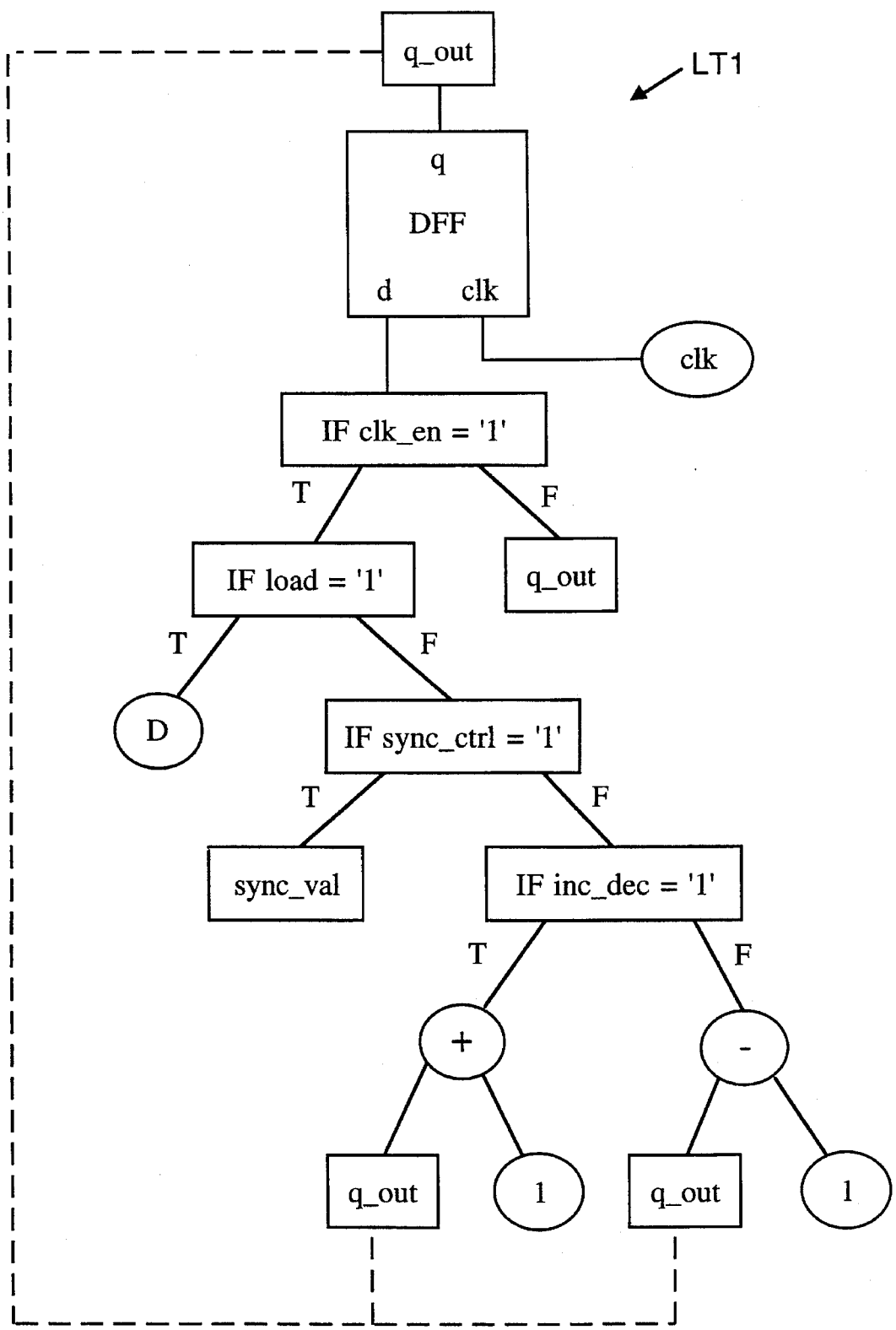
FIG. 13a is a library expression tree for a counter component.

Assume that components are available in the library as represented by the library expression trees of FIGS. 13a, 13b, 13c, 13d, 13e, and 13f, which correspond to library expression trees for a counter component, an incrementor-decrementor component, an incrementor component, a decrementor component, a multiplexor component, and a D Flip-Flop (DFF) component, respectively, in the library. By matching the IC expression tree for the up-down counter of FIG. 12 with the components in the library as illustrated by the trees of FIGS. 13a–13f, a set of matches are obtained. The HDL descriptions corresponding to these tree are as follows:

Listing 2: HDL For Counter Component (FIG. 13a)

```
if clk'event and clk = '1' then
    if clk_en = '1' then
        if load = '1' then
            q_out <= d;
        elsif sync_ctrl = '1' then
            q_out <= sync_val;
        elsif inc_dec = '1' then
            q_out <= q_out + '1';
        else
            q_out <= q_out - '1';
        end if;
    end if;
end if;
```

Figure 13B:
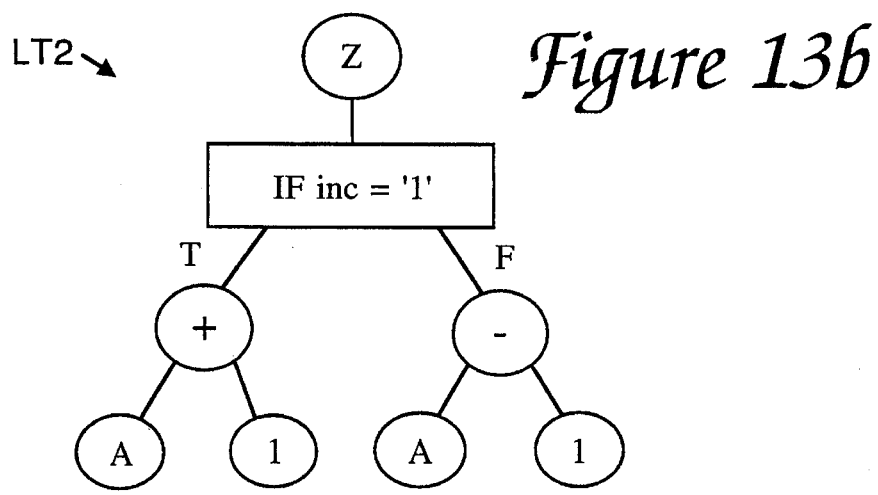
FIG. 13b is a library expression tree for an incrementor-decrementor component.

Listing 3: HDL For incrementor-Component (FIG. 13b)

```
if inc = '1' then
    Z <= A + '1';
else
    Z <= A - '1';
end if;
```

Listing 4: HDL For Increment Component (FIG. 13c)

```
Z <= A + '1';
```

Listing 5: HDL For Decrement Component (FIG. 13d)

```
Z <= A - '1';
```

Figure 13E:
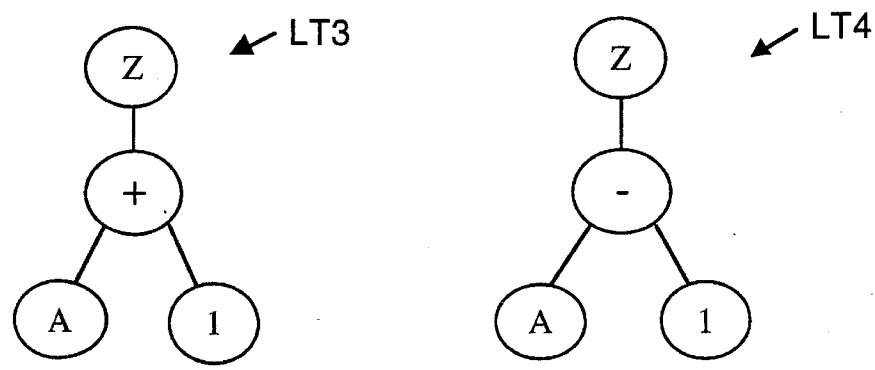
FIG. 13e is a library expression tree for a multiplexor component.
Figure 13E:
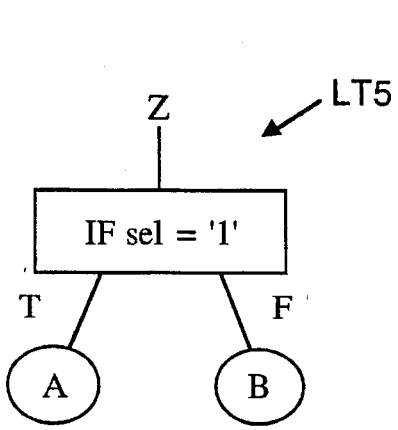

Listing 6: HDL for multiplexor component (FIG. 13e)

```
if sel = '1' then
    Z <= A;
else
    Z <= B;
end if;
```

Figure 13F:
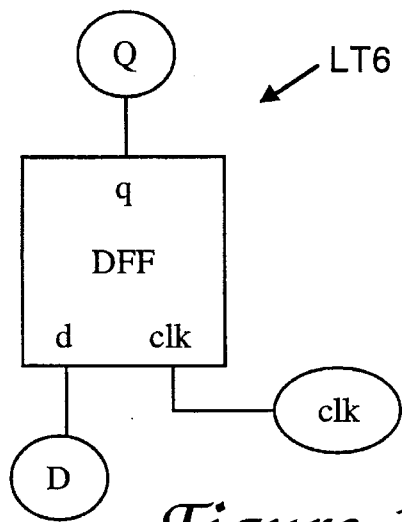
FIG. 13f is a library expression tree for a D Flip-Flop (DFF) component.

Listing 7: HDL for D Flip-flop component (FIG. 13f)

```
if clk'event and clk = '1' then
    q <= d;
end if;
```

When process 88 is applied to the up-down counter example of FIG. 12, the matches of Table 1 are obtained. In Table 1, a library tree will referred to as "LTX", where "X" is a number associated with the library tree. Therefore, library tree 1 (LT1) is shown in FIG. 13a, LT2 is shown in FIG. 13b, LT3 is shown in FIG. 13c, LT4 is shown in FIG. 13d, LT5 is shown in FIG. 13e, and LT6 is shown in FIG. 13f.

It should be noted that, in this example, node N1 represents the cycle in the graph. It is marked as "visited" after it is first visited. Thereafter, node N1 is not processed again even thought it has been pushed on the terminal stack, since it has already been visited, as explained in step 108 of process 88, above.

TABLE 1

Map Between IC and Library Expression Trees

| Step | Match Stack | Terminal Stack | Maps |
|---|---|---|---|
| 1 | LT1,LT6 | — | — |
| 2 | LT6 | N5,N1,N6 | |
| 3 | LT6 | N1,N6 | |
| 4 | LT6 | N6 | |

TABLE 1-continued

Map Between IC and Library Expression Trees

| Step | Match Stack | Terminal Stack | Maps |
|---|---|---|---|
| 5 | LT6 | — | |
| 6 | LT6 | — | {LT1} |
| 7 | — | N2 | {LT1},LT6 |
| 8 | LT2,LT5 | — | {LT1},LT6 |
| 9 | LT5 | N5,N1,N2 | {LT1},LT6,LT2 |
| 10 | LT5 | N1,N2 | {LT1},LT6,LT2 |
| 11 | LT5 | N2 | {LT1},LT6,LT2 |
| 12 | LT5 | — | {LT1},{LT6,LT2} |
| 13 | — | N3, N4 | {LT1},{LT6,LT2},LT6,LT5 |
| 14 | LT3 | N4 | {LT1},{LT6,LT2},LT6,LT5 |
| 15 | — | N5, N1,N4 | {LT1},{LT6,LT2},LT6,LT5,LT3 |
| 16 | — | N1, N4 | {LT1},{LT6,LT2},LT6,LT5,LT3 |
| 17 | — | N4 | {LT1},{LT6,LT2},LT6,LT5,LT3 |
| 18 | LT4 | — | {LT1},{LT6,LT2},LT6,LT5,LT3 |
| 19 | — | N1 | {LT1},{LT6,LT2},LT6,LT5,LT3,LT4 |
| 20 | — | N1 | {LT1},{LT6,LT2},LT6,LT5,LT3,LT4 |
| 21 | — | — | {LT1},{LT6,LT2},{LT6,LT5,LT3,LT4} |

Complete maps are found in steps 6, 12, and 21, and are bracketed by curly brackets "{" and "}" as seen above. As can be seen, the match 30 found in step 6 maps up-down counter of FIG. 12 to the counter component in the library as shown in FIG. 13*a*. A single counter component can be used with the following mapping:

LISTING 8: Counter Component in HDL

```
q_out => sum
clk => clk
inc_dec => increment
clk_en => '1'
sync_ctrl => '0'
load = '0'
```

In the prior art, matches could only be found as indicated in steps 12 and 21 of the table of Table 1. In step 12, the logic was synthesized as a DFF combined with an incrementor-decrementor. In step 21, the logic was synthesized as a DFF, a multiplexor, an incrementor, and a decrementor.

Both of the implementations of steps 12 and 21 are less optimized than the counter component of Listing 2.

It should be understood that the present invention may be embodied in many other specific forms without departing from the spirit or scope of the invention. Therefore, the present examples are to be considered as illustrative and not restrictive, and the invention is not to be limited to the details given herein, but may be modified within the scope of the appended claims.

What is claimed is:

1. A method for fabricating an integrated circuit comprising:

developing a set of circuit specifications for an integrated circuit;

encoding said set of circuit specifications in a hardware description language and inputting said hardware description language into a digital computer;

providing a datapath library including both sequential components and combinational components, wherein said sequential components exhibit sequential logic having an output dependent on inputs and also dependent on a state of a memory unit included within said sequential component, and wherein said combinational components exhibit combinational logic having an output only dependent on inputs to said combinational logic;

synthesizing from said hardware description language and on said computer a netlist including a sequential component selected from said datapath library, said synthesizing step including generating IC expression trees from said hardware description language and synthesizing said netlist utilizing said IC expression trees and said datapath library; and fabricating the integrated circuit as specified by said netlist.

2. A method for fabricating an integrated circuit as recited in claim 1 wherein said netlist further includes a combinational component.

3. A method for fabricating an integrated circuit as recited in claim 2 wherein said netlist further includes random logic, wherein said random logic includes logic of said circuit specifications that is not included in datapaths of said circuit specifications.

4. A method for fabricating an integrated circuit as recited in claim 3 wherein said step of synthesizing a netlist comprises the steps of:

parsing said hardware description language into a control data flow graph;

generating an IC expression tree for each output of the control data flow graph;

partitioning each IC expression tree into a random logic category and a datapath category;

synthesizing random logic using logic synthesis, said logic synthesis utilizing a provided gate library;

synthesizing datapath using datapath synthesis, said datapath synthesis utilizing said datapath library; and combining said datapath and said random logic to form said netlist.

5. A method for fabricating an integrated circuit as recited in claim 4, wherein said step of synthesizing datapath comprises the steps of:

generating a component output expression tree for each output of each component in said datapath library;

matching each IC expression tree against each component output expression tree to create a map; and creating a datapath netlist using said map and optimization criteria.

6. A method for fabricating an integrated circuit as recited in claim 5, wherein said library components are encoded in said hardware description language, and further comprising the step of parsing said library components into component control data flow graphs, wherein said step of generating a component output expression tree operates on said component control data flow graphs.

7. A method for fabricating an integrated circuit as recited in claim 6 wherein said optimization criteria include at least one of area, speed and delay criteria.

8. A method for fabricating an integrated circuit as recited in claim 7 wherein said matching step uses a recursive matching process to produce a set of matches between said library components and said IC expression tree.

9. A method for fabricating an integrated circuit as recited in claim 8 wherein said step of fabricating an integrated circuit comprises:

producing IC mask specifications based upon said netlist;

producing a plurality of IC masks from said mask specifications; and using said plurality of IC masks to fabricate said integrated circuit.

10. A method for datapath synthesis comprising:

providing a datapath library including sequential components and combinational components, wherein said sequential components exhibit sequential logic having an output dependent on inputs and dependent on a state of a memory unit included within said sequential component, and wherein said combinational components exhibit combinational logic having an output only dependent on inputs to said combinational logic;

developing a set of circuit specifications for an integrated circuit;

encoding said set of circuit specifications in a hardware description language;

developing a plurality of IC expression trees derived from said hardware, description language;

matching said plurality of IC expression trees with library expression trees derived from said datapath library to provide a map of matches; and synthesizing both sequential components and combinational components for said integrated circuit according to said map.

11. A method for datapath synthesis as recited in claim 10 wherein said step of generating a plurality of IC expression trees includes the steps of:

parsing said hardware description language into a control data flow graphs; and generating an IC expression tree for each output of said control data flow graphs.

12. A method for datapath synthesis as recited in claim 11 wherein said step of generating a plurality of IC expression trees further includes the step of:

partitioning said IC expression trees into a random logic category and a datapath category, where only said IC expression trees in said datapath category are subject to said matching step.

13. A method for datapath synthesis as recited in claim 12 further comprising the step of:

developing said library expression trees from said datapath library.

14. A method for datapath synthesis as recited in claim 13 wherein said sequential components and said combinational components of said datapath library are written in said hardware description language, and wherein said step of developing said library expression trees includes the steps of:

parsing said hardware description language of said sequential components and said combinational components; and generating an expression tree for each output of each component in said library.

15. A method for datapath synthesis as recited in claim 12 wherein said step of matching implements a recursive matching process.

16. A method for datapath synthesis as recited in claim 13 wherein said recursive matching process utilizes a stack to recursively match all combinations of said components in said library with said IC expression tree.

17. A method for datapath synthesis as recited in claim 10 wherein said step of synthesizing includes the steps of:

creating a netlist according to both said map and to optimization criteria.

18. A method for datapath synthesis as recited in claim 17 wherein said optimization criteria include at least one of area, speed and delay criteria.

19. A datapath synthesizer comprising:

a digital processor;

memory coupled to said digital processor;

a datapath library stored in said memory, said datapath library including sequential components and combinational components, wherein said sequential components exhibit sequential logic having an output dependent on inputs and dependent on a state of a memory unit included within said sequential component, and wherein said combinational components exhibit combinational logic having an output only dependent on inputs to said combinational logic;

an input device for inputting to said memory a set of circuit specifications for an integrated circuit encoded in a hardware description language;

an IC expression tree generator which develops, using said digital processor, a plurality of IC expression trees derived from said hardware description language;

a matcher which maps, using said digital processor, said plurality of IC expression trees with library expression trees derived from said datapath library to provide a map; and a synthesizer, using said digital processor, to synthesize a netlist for said integrated circuit including both sequential components and combinational components according to said map.

20. A datapath synthesizer as recited in claim 19 further comprising:

a parser to convert, using said digital processor, said hardware description language into a control data flow graphs; and a generator to produce, using said digital processor, an IC expression tree for each output of said control data flow graphs.

21. A datapath synthesizer as recited in claim 20 wherein IC expression tree generator includes:

a partitioner to separate, using said digital processor, said IC expression trees into a random logic category and a datapath category, where only said IC expression trees in said datapath category are subjected to said matcher.

* * * * *